(12) United States Patent
Wang et al.

(10) Patent No.: US 12,340,056 B2
(45) Date of Patent: Jun. 24, 2025

(54) ARRAY SUBSTRATE, MANUFACTURING METHOD AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Tingting Wang, Beijing (CN); Xu Wang, Beijing (CN); Qi Wang, Beijing (CN); Yan Yan, Beijing (CN); Yu Ma, Beijing (CN); Xiaofeng Yin, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/579,896

(22) PCT Filed: Oct. 31, 2022

(86) PCT No.: PCT/CN2022/128709
§ 371 (c)(1),
(2) Date: Jan. 17, 2024

(87) PCT Pub. No.: WO2024/092431
PCT Pub. Date: May 10, 2024

(65) Prior Publication Data
US 2025/0077030 A1    Mar. 6, 2025

(51) Int. Cl.
*G06F 3/044* (2006.01)
*G02F 1/1333* (2006.01)
(Continued)

(52) U.S. Cl.
CPC ........ *G06F 3/0445* (2019.05); *G02F 1/13338* (2013.01); *G02F 1/133512* (2013.01);
(Continued)

(58) Field of Classification Search
CPC ... G06F 3/0445; G06F 3/0446; G02F 1/13338
(Continued)

(56) References Cited

U.S. PATENT DOCUMENTS 10,969,885 B2 * 4/2021 Liu .................. G02F 1/134309
2014/0152938 A1 6/2014 Lee et al.
(Continued)

FOREIGN PATENT DOCUMENTS

CN    104865726 A    8/2015
CN    106201136 A    12/2016
(Continued)

*Primary Examiner* — Christopher M Raabe
(74) *Attorney, Agent, or Firm* — BROOKS KUSHMAN P.C.

(57) ABSTRACT

An array substrate, a manufacturing method and a display device. The array substrate includes: a base substrate; a plurality of gate lines and a plurality of data lines; a plurality of touch signal lines; a plurality of touch electrodes; a plurality of pixel electrodes; and an insulation layer. The touch signal line and a transparent conductive layer where the pixel electrode is located are arranged at a side of the insulation layer away from a transparent conductive layer where the touch electrode is located, an orthogonal projection of the pixel electrode onto the base substrate is separated from an orthogonal projection of the touch signal line onto the base substrate to be insulated from each other, and each touch electrode is coupled to at least one touch signal line through a via hole in the insulation layer.

20 Claims, 4 Drawing Sheets

(51) Int. Cl.
  *G02F 1/1335* (2006.01)
  *G06F 3/041* (2006.01)
  *H10D 86/01* (2025.01)
  *H10D 86/40* (2025.01)
  *H10D 86/60* (2025.01)

(52) U.S. Cl.
  CPC .......... *G06F 3/0412* (2013.01); *G06F 3/0446* (2019.05); *H10D 86/021* (2025.01); *H10D 86/441* (2025.01); *H10D 86/60* (2025.01); *G06F 2203/04103* (2013.01); *G06F 2203/04107* (2013.01); *G06F 2203/04111* (2013.01)

(58) Field of Classification Search
  USPC .......................................................... 349/12
  See application file for complete search history.

(56) References Cited

U.S. PATENT DOCUMENTS

| | | |
|---|---|---|
| 2016/0170524 A1 | 6/2016 | Kim et al. |
| 2016/0357048 A1 | 12/2016 | Zhou et al. |
| 2018/0356925 A1 | 12/2018 | Liu et al. |
| 2020/0110479 A1 | 4/2020 | Liu et al. |
| 2022/0283674 A1* | 9/2022 | Maeda ................ H10D 86/021 |
| 2022/0373848 A1 | 11/2022 | Chen et al. |
| 2023/0176667 A1* | 6/2023 | Su .......................... G06F 3/0443 |
| | | 345/174 |
| 2024/0061521 A1* | 2/2024 | Su .......................... G06F 3/0443 |
| 2024/0105735 A1* | 3/2024 | Yoshino ................ G06F 3/0412 |
| 2024/0385718 A1* | 11/2024 | Wu ........................ G06F 3/0412 |

FOREIGN PATENT DOCUMENTS

| | | |
|---|---|---|
| CN | 106855669 A | 6/2017 |
| CN | 109557728 A | 4/2019 |
| CN | 114077077 A | 2/2022 |
| CN | 216052544 U | 3/2022 |
| CN | 216595827 U | 5/2022 |

* cited by examiner

ARRAY SUBSTRATE, MANUFACTURING METHOD AND DISPLAY DEVICE

CROSS-REFERENCE TO RELATED APPLICATION

This application is the U.S. national phase of PCT Application No. PCT/CN2022/128709 filed on Oct. 31, 2022, which is incorporated herein by reference in its entirety.

TECHNICAL FIELD

The present disclosure relates to the field of touch display technology, in particular to an array substrate, a manufacturing method and a display device.

BACKGROUND

With the rapid development of the display technology, touch screens have been widely used. For an In-Cell (built-in) touch screen, a touch electrode unit is built in a Liquid Crystal Display (LCD) screen to reduce a thickness of a module as well as the manufacture cost, so the In-Cell touch screen has attracted more and more attentions and becomes a new development trend due to such advantages as high integration level, being light and thin, low manufacture cost, low power consumption, high image quality, and being capable of achieving a multi-touch function.

SUMMARY

An object of the present disclosure is to provide an array substrate, a manufacturing method and a display device, so as to improve the touch performance and the product quality.

The present disclosure provides the following technical solutions.

In one aspect, the present disclosure provides in some embodiments an array substrate, including: a base substrate; a plurality of gate lines extending in a first direction and a plurality of data lines extending in a second direction on the base substrate, each gate line crossing the plurality of data lines to define a plurality of sub-pixels; a plurality of touch signal lines extending in the second direction and arranged in light shielding regions of the sub-pixels; a plurality of touch electrodes, each touch electrode including a plurality of touch sub-electrodes, each touch sub-electrode being arranged in at least one of the sub-pixels; a plurality of pixel electrodes, each pixel electrode being arranged in at least one of the sub-pixels, one of a layer where one of the pixel electrode and the touch electrode closer to the base substrate is located being a first transparent conductive layer, and a layer where the other is located being a second transparent conductive layer; and an insulation layer arranged between the first transparent conductive layer and the second transparent conductive layer. The touch signal line and a transparent conductive layer where the pixel electrode is located are arranged at a side of the insulation layer away from a transparent conductive layer where the touch electrode is located, the touch signal line is in direct contact with the transparent conductive layer where the pixel electrode is located, an orthogonal projection of the pixel electrode onto the base substrate is separated from an orthogonal projection of the touch signal line onto the base substrate to be insulated from each other, and each touch electrode is coupled to at least one touch signal line through a via hole in the insulation layer.

In a possible embodiment of the present disclosure, the layer where the touch electrode is located is the first transparent conductive layer, and the layer where the pixel electrode is located is the second transparent conductive layer.

In a possible embodiment of the present disclosure, a film layer thickness of the insulation layer is greater than or equal to 5000 Å and less than or equal to 20000 Å.

In a possible embodiment of the present disclosure, the touch signal line includes a first portion arranged at a side of the pixel electrode in the first direction and extending in the second direction, and an orthogonal projection of the first portion onto the base substrate does not coincide with an orthogonal projection of a touch sub-electrode adjacent to the first portion in the first direction onto the base substrate and an orthogonal projection of a pixel electrode adjacent to the first portion in the first direction onto the base substrate.

In a possible embodiment of the present disclosure, the touch signal line further includes a second portion arranged at a side of the pixel electrode in the second direction, an orthogonal projection of the second portion onto the base substrate does not coincide with an orthogonal projection of a pixel electrode adjacent to the second portion in the second direction onto the base substrate, and each second portion is electrically coupled to a touch sub-electrode through a via hole in the insulation layer.

In a possible embodiment of the present disclosure, the touch sub-electrodes of a same touch electrode in the first direction are coupled to each other, orthogonal projections of the touch sub-electrodes of different touch electrodes in the first direction onto the base substrate are separated from each other and decoupled from each other, orthogonal projections of at least a part of adjacent touch sub-electrodes of the same touch electrode in the second direction onto the base substrate are separated from each other and decoupled from each other, and are electrically coupled to at least one touch signal line so that at least a part of the touch sub-electrodes of the same touch electrode in the second direction are electrically coupled to each other, and orthogonal projections of the touch sub-electrodes of different touch electrodes in the second direction onto the base substrate are separated from each other and decoupled from each other.

In a possible embodiment of the present disclosure, the touch sub-electrodes of a same touch electrode in the first direction are coupled to each other, orthogonal projections of the touch sub-electrodes of different touch electrodes in the first direction onto the base substrate are separated from each other and decoupled from each other, adjacent touch sub-electrodes of a same touch electrode in the second direction are coupled to each other, and orthogonal projections of the touch sub-electrodes of different touch electrodes in the second direction onto the base substrate are separated from each other and decoupled from each other.

In a possible embodiment of the present disclosure, in a direction parallel to the base substrate and perpendicular to the second direction, a minimum distance between a boundary of the first portion and a boundary of the touch electrode adjacent to the first portion in the first direction is greater than or equal to 2.5 μm and less than or equal to 10 μm.

In a possible embodiment of the present disclosure, the data line includes a third portion arranged at a side of the pixel electrode in the first direction and extending in the second direction, and the orthogonal projection of the first portion onto the base substrate at least partially overlaps with an orthogonal projection of the third portion onto the base substrate.

In a possible embodiment of the present disclosure, the touch signal line is provided with a center line extending in an extension direction of the touch signal line, and in the direction parallel to the base substrate and perpendicular to the second direction, distances between a center line of the first portion and boundaries of two touch sub-electrodes arranged on two opposite sides of first portion in the first direction are the same.

In a possible embodiment of the present disclosure, the array substrate further includes a plurality of protection patterns extending in the second direction, the plurality of protection patterns is arranged in the light shielding regions of the sub-pixels and covers at least a side surface of the touch signal line away from the insulation layer, and an orthogonal projection of the protection pattern onto the base substrate at least partially overlaps with an orthogonal projection of the touch signal line onto the base substrate.

In a possible embodiment of the present disclosure, the protection pattern is made of a same material as the pixel electrode, and is arranged on the first transparent conductive layer or the second transparent conductive layer where the pixel electrode is located.

In a possible embodiment of the present disclosure, in the direction parallel to the base substrate and perpendicular to the second direction, a size of the touch signal line is less than or equal to a size of the protection pattern.

In a possible embodiment of the present disclosure, the touch signal line is provided with a center line extending in an extension direction of the touch signal line, the protection pattern is provided with a center line extending in an extension direction of the protection pattern, and an orthogonal projection of the center line of the touch signal line onto the base substrate coincides with an orthogonal projection of the center line of the protection pattern onto the base substrate.

In a possible embodiment of the present disclosure, in the first direction, a boundary of an orthogonal projection of the protection pattern onto the base substrate exceeds a boundary of an orthogonal projection of the touch signal line onto the base substrate by 0 to 5μ m.

In a possible embodiment of the present disclosure, the protection pattern includes a fifth portion arranged at a side of the pixel electrode in the first direction and extending in the second direction, and an orthogonal projection of the fifth portion onto the base substrate does not coincide with an orthogonal projection of one touch electrode adjacent to the fifth portion in the first direction onto the base substrate and an orthogonal projection of one pixel electrode adjacent to the fifth portion in the first direction onto the base substrate.

In a possible embodiment of the present disclosure, the protection pattern further includes a sixth portion arranged at a side of the pixel electrode in the second direction, an orthogonal projection of the sixth portion onto the base substrate does not coincide with an orthogonal projection of one pixel electrode adjacent to the sixth portion in the second direction onto the base substrate, the sixth portion at least partially exceeds the second portion in a width direction of the second portion, the width direction of the second portion is perpendicular to a wiring direction of the second portion, and the sixth portion covers the via hole.

In a possible embodiment of the present disclosure, in the first direction, a minimum distance between a boundary of the fifth portion and a boundary of the touch electrode adjacent to the fifth portion is greater than or equal to 2.5 μm.

In a possible embodiment of the present disclosure, each pixel electrode includes a plurality of slits extending in the second direction.

In another aspect, the present disclosure provides in some embodiments a display device, including the above-mentioned array substrate, a counter substrate arranged opposite to the array substrate, and a liquid crystal layer arranged between the array substrate and the counter substrate.

In a possible embodiment of the present disclosure, a black matrix is arranged on the counter substrate, an orthogonal projection of the black matrix onto the array substrate is located within the light shielding region of the sub-pixel, in the direction parallel to the base substrate and perpendicular to the second direction, a distance between a boundary of an orthogonal projection of the black matrix onto the base substrate and the boundary of the orthogonal projection of the pixel electrode in one sub-pixel adjacent to the black matrix onto the base substrate is the same as a distance between the boundary of the orthogonal projection of the black matrix onto the base substrate and a boundary of the orthogonal projection the pixel electrode in the other sub-pixel adjacent to the black matrix onto the base substrate, and a distance between the boundary of the orthogonal projection of the black matrix onto the base substrate and the boundary of the orthogonal projection of a touch sub-electrode in one sub-pixel adjacent to the data line onto the base substrate is the same as a distance between the boundary of the orthogonal projection of the black matrix onto the base substrate and a boundary of an orthogonal projection a touch sub-electrode in the other sub-pixel adjacent to the black matrix onto the base substrate.

In yet another aspect, the present disclosure provides in some embodiments a method for manufacturing the above-mentioned array substrate, including: providing a base substrate; and forming a plurality of gate lines, a plurality of data lines, a plurality of touch signal lines, a plurality of touch electrodes, a plurality of pixel electrodes and an insulation layer on the base substrate. Each gate line extending in the first direction crosses the plurality of data lines extending in the second direction to define a plurality of sub-pixels, and the plurality of touch signal lines extends in the second direction and is arranged in light shielding regions of the sub-pixels; each touch electrode includes a plurality of touch sub-electrodes, and each touch sub-electrode is arranged in at least one of the sub-pixels; a layer where one of the pixel electrode and the touch electrode closer to the base substrate is located is a first transparent conductive layer, and a layer where the other is located is a second transparent conductive layer; and the insulation layer is arranged between the first transparent conductive layer and the second transparent conductive layer, the touch signal line and the transparent conductive layer where the pixel electrode is located are arranged at the side of the insulation layer away from a transparent conductive layer where the touch electrode is located, the touch signal line is in direct contact with a transparent conductive layer where the pixel electrode is located, an orthogonal projection of the pixel electrode onto the base substrate is separated from an orthogonal projection of the touch signal line onto the base substrate to be insulated from each other, and each touch electrode is coupled to at least one touch signal line through a via hole in the insulation layer.

In a possible embodiment of the present disclosure, the forming the plurality of gate lines, the plurality of data lines, the plurality of touch signal lines, the plurality of touch electrodes, the plurality of pixel electrodes and the insulation layer on the base substrate includes: forming the first transparent conductive layer on the base substrate and patterning the first transparent conductive layer to form a pattern including the touch electrode; forming the insulation layer on the first transparent conductive layer; forming a first metal layer on the insulation layer and patterning the first metal layer to form a pattern including the touch signal line; and forming the second transparent conductive layer on the first metal layer and patterning the second transparent conductive layer to form a pattern including the pixel electrode.

In a possible embodiment of the present disclosure, the forming the plurality of gate lines, the plurality of data lines, the plurality of touch signal lines, the plurality of touch electrodes, the plurality of pixel electrodes and the insulation layer on the base substrate further includes forming a protection pattern covering the touch signal lines, and the protection pattern and the pattern including the pixel electrode are formed by patterning the second transparent conductive layer through a single patterning process.

The present disclosure has the following beneficial effects.

According to the array substrate, the manufacturing method and the display device in the embodiments of the present disclosure, and the insulation layer is arranged between the first transparent conductive layer and the second transparent conductive layer, the touch signal line and the pixel electrode are laminated one on another at a side of the touch electrode away from the insulation layer. As compared with the related art where two insulation layers (obtained through two processes) are between the touch electrode and the pixel electrode and the touch signal line is arranged in a layer between the touch electrode and the pixel electrode, it is able to reduce one process for forming the insulation layer, thereby to reduce the tact time. In addition, it is able to reduce a touch load and reduce a charging rate of the touch electrode at a proximal end and at a remote end, thereby to improve the touch performance.

DETAILED DESCRIPTION

Figure 1:
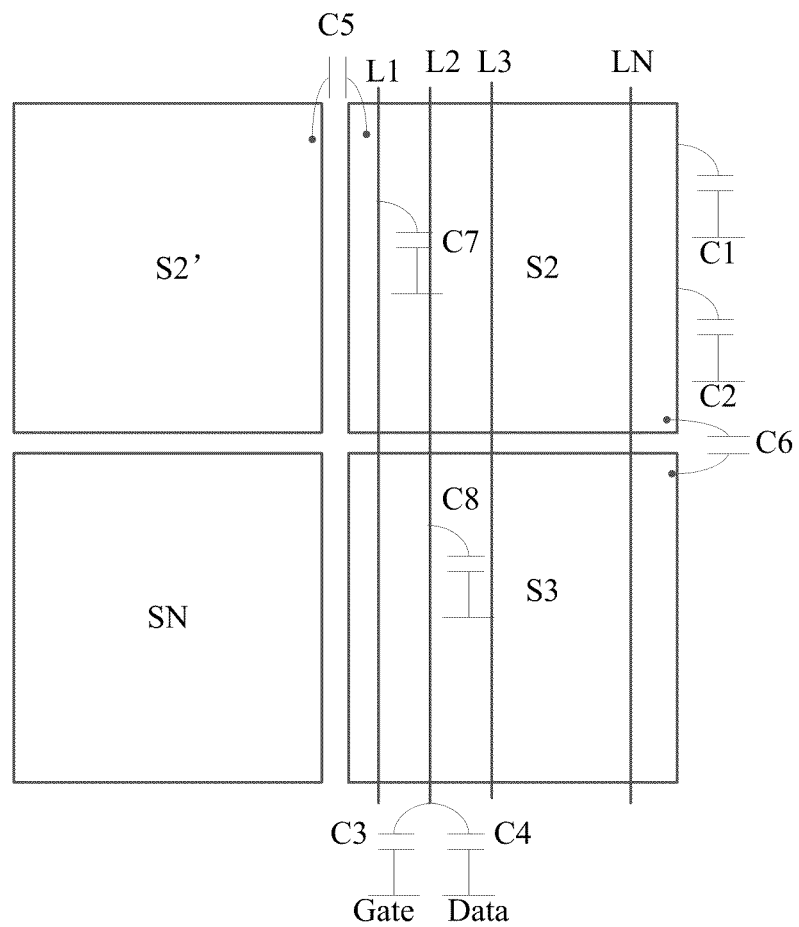
FIG. 1 is a schematic view showing a capacitor in a Full In-Cell (FIC) display panel.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the embodiments of the present disclosure, two structures "arranged at a same layer" refers to that the two structures are formed by a same material layer so that they are located in a same layer, but it does not mean that a distance between each of them and a base substrate is equal, nor that they are completely the same as any other layer structure on the base substrate.

In the embodiments of the present disclosure, "patterning process" refers to steps of forming a structure with a specific pattern, which may be a photolithography process including one or more steps of applying a material layer, coating a photoresist, exposing, developing, etching, or removing the photoresist. Of course, the "patterning process" may further be an imprinting process, an inkjet printing process, or any other process.

The present disclosure will be described hereinafter in a clear and complete manner in conjunction with the drawings. In the drawings, same elements are identified with same reference numerals. For clarification, shapes and sizes of the components in the drawings are for illustrative purposes only, but do not reflect an actual scale. In addition, some known components are not shown in the drawings.

Many specific details, such as structure, material, size, treatment processes and treatment technique, will be described hereinafter in order to facilitate the understanding of the present disclosure. However, for a person skilled in the art, the present disclosure may also be implemented not in accordance with these specific details.

The following description will be given at first.

In the related art, each liquid crystal pixel on a liquid crystal display is driven by TFTs integrated therein. Based on an operation principle of a touch screen and a medium for transmitting information, the touch screen may be divided into four types: a resistive type, a capacitive type, an infrared type and a surface acoustic wave type. The resistive-type touch screen and the capacitive-type touch screen are widely used, and a projected capacitive type touch screen is most widely used to achieve a multi-touch function. However, these touch screens have such disadvantages as high manufacture cost and being thick. There currently exists such a new trend to provide a touch screen with low manufacture cost, lightweight and thinness.

In order to provide a thin and light touch panel, the touch panel is integrated with an LCD panel. An In-Cell touch scheme, in which the touch panel is built into the LCD panel, has attracted more and more attentions.

The In-Cell touch technology includes three types, i.e., a resistive type, a capacitive type and an optical type. The capacitive mode includes self-capacitive touch and mutual-capacitive touch. In the self-capacitive touch mode, a transparent conductive layer as a common electrode (Vcom) on an array substrate is divided into a plurality of blocks which serve as touch electrodes. One end of a touch signal (Tx) line is coupled to the touch electrode through a via hole, and the other end of the Tx line is coupled to a driving integrated circuit (IC). When a finger touches the array substrate, a capacitance value of the touch electrode at a corresponding touch position changes, and the driving IC determines the touch position through detecting the change in the capacitance value, so as to achieve a touch function.

In the related art, for an FIC touch display panel, touch electrodes and touch signal lines are integrated inside the array substrate, so that the touch function is integrated in an LCD panel when the array substrate is used to manufacture the LCD panel, thereby to provide the LCD panel with an in-cell touch structure. For the LCD panel with the FIC structure, the touch function and a display function are integrated together, so as to achieve one-stop production, and provide the LCD panel with such advantages as high integration level, being light and thin, low manufacture cost, low power consumption, high image quality and being capable of achieving a multi-touch function. A charging rate of a remote end of the touch electrode needs to be evaluated in accordance with a capacitance of a touch product.

FIG. 1 shows capacitances in an FIC touch display panel. As shown in FIG. 1, S1, S2, S2', S3 . . . and SN represent several touch sub-electrodes, L1, L2 . . . and LN represent touch signal lines, C1 represents a capacitance between S2 and the gate line, C2 represents a capacitance between S2 and the data line, C3 represents a capacitance between the touch signal line L2 and the gate line, C4 represents a capacitance between the touch signal line L2 and the data line, C5 represents a capacitance between S2 and S2', C6 represents a capacitance between S2 and S3, C7 represents a capacitance between S2 and the touch signal lines L1 to LN, and C8 represents a capacitance between the touch signal line L2 and S1 to SN.

It is found that, the capacitance C1 between S2 and the gate line and the capacitance C2 between S2 and the data line are both lateral capacitances, which account for a small proportion of the entire touch loading. The capacitance C3 between the touch signal line and the gate line and the capacitance C4 between the touch signal line and the data line are overlapping capacitances, which do not account for a major proportion of the entire capacitance, due to an organic film layer having a thickness of 20000 Å between the touch signal line and the gate line as well as the data line. The capacitance C5 between S2 and S2' and the capacitance C6 between S2 and S3 are transverse capacitance and longitudinal capacitance of the touch sub-electrodes, i.e., the lateral capacitances, and account for a very small proportion of the entire touch capacitance. The capacitance C7 between S2 and the touch signal lines L1 to LN and the capacitance C8 between L2 and S1 to SN are capacitances between the touch sub-electrodes and the touch signal lines, which depend on an overlapping area between the touch signal lines and the touch sub-electrodes and a thickness of an insulation layer. In order to reduce the touch loading of the FIC touch panel, principally it is necessary to reduce the capacitance between the touch signal lines and the touch sub-electrodes. In order to meet the requirement on the charging rate, RCtotal is less than 1.5 us and Ctotal=C1+C2+C3 . . . +C8.

In the related art, the liquid crystal touch display panel with the FIC touch structure includes an array substrate and a counter substrate opposite to the array substrate to form a cell. The array substrate includes a base substrate, a plurality of switch TFTs arranged on the base substrate, a first transparent conductive layer (1ITO) arranged on the base substrate, a first insulation layer (PVX1) arranged on the first transparent conductive layer, a touch signal line (TX) arranged on the first insulation layer, a second insulation layer (PVX2) arranged on the touch signal line and a second transparent conductive layer (2ITO) arranged on the second insulation layer. A pattern of the first transparent conductive layer includes a plurality of touch sub-electrodes, a pattern of the second transparent conductive layer includes a plurality of pixel electrodes, a black matrix (BM) is arranged on the counter substrate, and the black matrix covers the touch signal lines and the data lines.

However, there are the following problems in the related art. Firstly, the touch loading is too large, and it is found through researches that, a main source of the touch loading is an overlapping area between the touch signal lines and the first transparent conductive layer (the touch sub-electrodes). Secondly, the process for the pixels is complex, and two processes are required for the deposition of the two insulation layers, so the tact time is seriously adversely affected.

An object of the present disclosure is to provide an array substrate, a manufacturing method and a display device, so as to reduce the touch loading, improve the touch performance, reduce process steps and reduce the tact time.

As shown in the drawings, the present disclosure provides in some embodiments an array substrate, which includes: a base substrate 100; a plurality of gate lines 200 extending in a first direction X and a plurality of data lines 300 extending in a second direction Y arranged on the base substrate 100, and each gate line 200 crossing the plurality of data lines 300 to define a plurality of sub-pixels; a plurality of touch signal lines 400 extending in the second direction Y and arranged in light shielding regions of the sub-pixels; a plurality of touch electrodes 500, each touch electrode 500 including a plurality of touch sub-electrodes 510, and each touch sub-electrode 510 being arranged in at least one of the sub-pixels; a plurality of pixel electrodes 600, each pixel electrode 600 being arranged in at least one of the sub-pixels, a layer where one of the pixel electrode 600 and touch electrode 500 closer to the base substrate 100 is located being a first transparent conductive layer, and a layer where the other one is located being a second transparent conductive layer; and an insulation layer 700 arranged between the first transparent conductive layer and the second transparent conductive layer. The touch signal line 400 and a transparent conductive layer where the pixel electrode 600 is located are arranged at a side of the insulation layer 700 away from a transparent conductive layer where the touch electrode 500 is located, the touch signal line 400 is in direct contact with the transparent conductive layer where the pixel electrode 600 is located, an orthogonal projection of the pixel electrode 600 onto the base substrate 100 is separated from an orthogonal projection of the touch signal line 400 onto the base substrate 100 to be insulated from each other, and each touch electrode 500 is coupled to at least one touch signal line 400 through a via hole in the insulation layer 700.

For example, the first direction X includes a horizontal direction, and the second direction Y includes a vertical direction.

Based on the above array substrate, the first transparent conductive layer is a first indium tin oxide (ITO) (1ITO) layer, the second transparent conductive layer is a second ITO (2ITO) layer, the 1ITO layer is arranged between the base substrate 100 and the 2ITO layer, e.g., the 1ITO layer includes a common electrode (Vcom), the 2ITO layer includes the pixel electrode 600, the insulation layer 700 is arranged between the 1ITO layer and the 2ITO layer, the touch signal line 400 and at least a part of a pattern of the 2ITO layer (e.g., a pattern of the pixel electrode) are directly formed on a surface of the insulation layer 700 away from the 1ITO layer. In the related art, two insulation layers are arranged between the 1ITO layer and the 2ITO layer, and the touch signal line is arranged between the two insulation layers. According to the embodiments of the present disclosure, merely one insulation layer is arranged between the 1ITO layer and the 2ITO layer, and the touch signal line is arranged at a same layer as a part of a pattern of the transparent conductive layer where the pixel electrode is located. A thickness of any insulation layer in the related art is less than a thickness of the insulation layer in the present disclosure. For example, a thickness of one PVX layer in the related art is 4000 Å, i.e., a distance between the touch signal line and the 1ITO is about 4000 Å; and in the embodiments of the present disclosure, a thickness of the insulation layer is greater than or equal to 5000 Å and less than or equal to 20000 Å, such as 5500 Å, 6000 Å, 6500 Å and 7000 Å. In this way, as compared with the array substrate in the related art, it is equivalent to shifting the touch signal line 400 to a side away from the 1ITO layer, i.e., a distance between the touch signal line 400 and the touch electrode 500 in a direction perpendicular to the base substrate 100 increases, so it is able to reduce a capacitance between the touch signal line 400 and the touch electrode 500, thereby to reduce the touch loading and improve the touch performance. In addition, merely one insulation layer 700 is arranged between the 1ITO layer and the 2ITO layer, so it is able to reduce one process for forming the insulation layer, thereby to reduce the tact time.

It should be appreciated that, the touch signal line 400 is coupled to a corresponding touch electrode 500 in the array substrate and a chip subsequently bonded onto the array substrate. When the array substrate is arranged opposite to a counter substrate to form an LCD panel and a touch operation is made in a touch region of the LCD panel, a touch signal generated by the touch electrode 500 in the array substrate is changed by the touch operation. The touch signal line 400 is used to transmit the touch signal collected by a touch unit to the chip, and the chip determines a specific touch position in accordance with the touch signal received from the touch signal line 400.

In a possible embodiment of the present disclosure, an aperture region corresponding to the sub-pixel is an actual light transmitting region of the sub-pixel, and a non-aperture region corresponding to the sub-pixel is a light shielding region of the sub-pixel. For the LCD panels with a same size, the larger the area of the aperture region, the larger the aperture ratio of the LCD panel, and the better the display quality of the LCD panel. The light shielding region surrounds the light transmitting region.

For example, a driving circuitry corresponding to the sub-pixel is arranged in the light shielding region corresponding to the sub-pixel, and the gate line 200 and the data line 300 are also arranged in the light shielding region. During the arrangement, the touch signal line 400 is arranged in the light shielding region of the sub-pixel and extends in an extension direction of the data line 300. In this way, it is able to shield the touch line 400 and the data line 300 through a black matrix on the counter substrate.

In some embodiments of the present disclosure, the touch electrode 500 also serves as a common electrode (Vcom), and correspondingly, the touch signal line 400 also serves as a common electrode line. Based on this, at a touch stage, the touch signal line 400 provides a touch driving signal to the touch electrode 500 and receives a touch feedback signal, and at a display stage, the touch signal line 400 provides a Vcom signal (i.e., a signal required by the common electrode during the display) to the touch electrode 500. When the touch electrode 500 serves as the common electrode and the touch signal line 400 serves as the common electrode line, it is able to reduce a thickness of the array substrate, thereby to reduce a thickness of a touch display panel.

In the case that the common electrodes serves as the touch electrodes 500 in a same touch sub-region, after the LCD panel is formed using the array substrate, a specific process of achieving the touch function will be described as follows.

At the touch stage, the touch signal line 400 provides a touch signal to the common electrode (i.e., the touch electrode 500) coupled to the touch signal line 400. When a touch operation is made in a touch region of the LCD panel, the touch signal corresponding to the touch electrode 500 at a touch position changes. The touch electrode 500 transmits the changed touch signal to the chip through the corresponding touch signal line 400, and the chip determines the touch position in accordance with the changed touch signal. At the display stage, the touch signal line 400 provides a common electrode signal for display to the common electrode coupled to the touch signal line 400, and a driving circuitry of the sub-pixel in the array substrate provides a driving signal to a corresponding pixel electrode 600, so as to generate an electric field for driving liquid crystals to deflect between the pixel electrode 600 and the common electrode, thereby to achieve the display function of the LCD panel.

In the embodiments of the present disclosure, a material of the base substrate 100 may be selected according to the practical need, e.g., glass.

Figure 3:
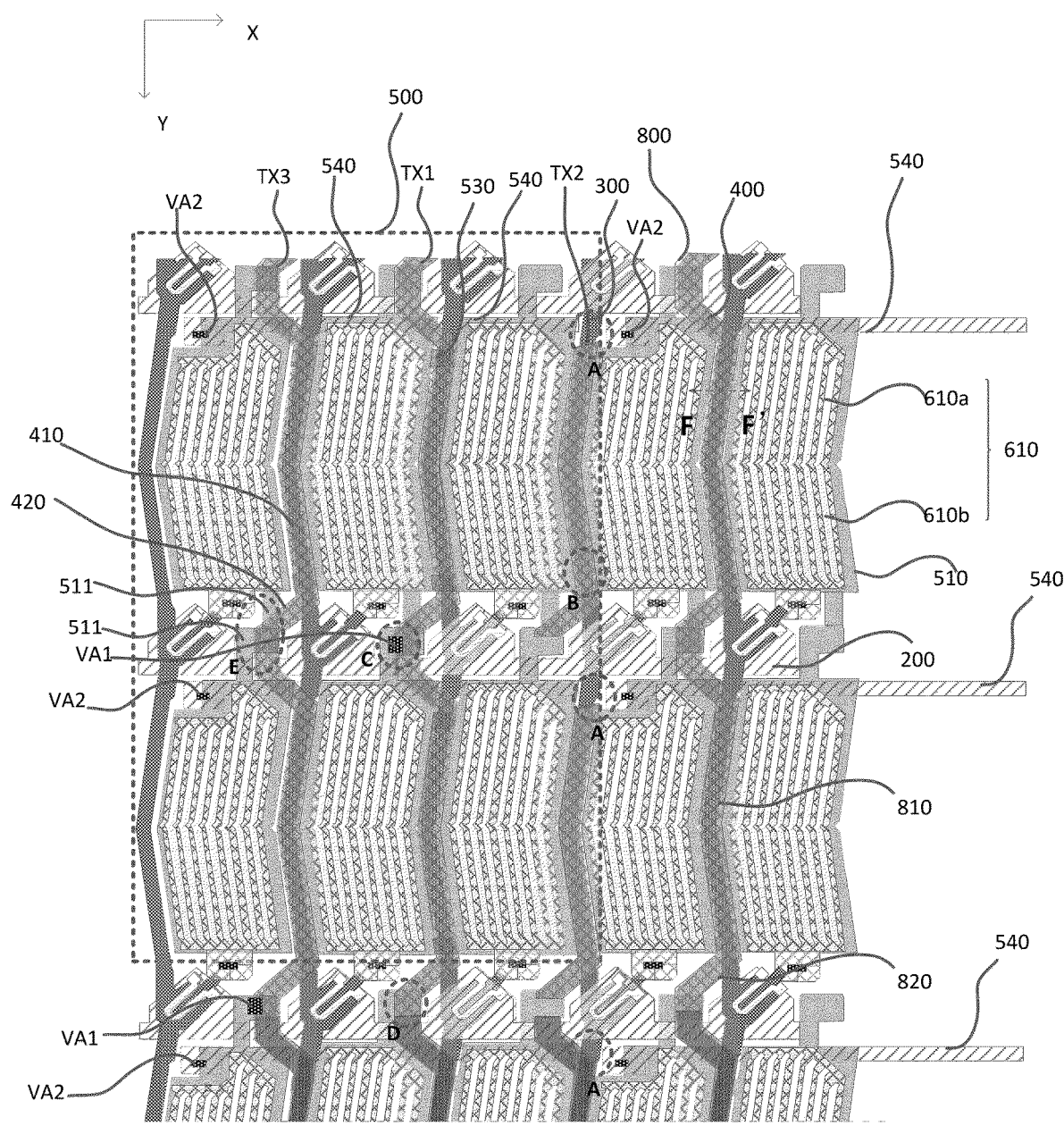
FIG. 3 is another schematic view showing the arrangement of the sub-pixels in the array substrate according to one embodiment of the present disclosure.

For example, as shown in FIG. 3, the layer where the touch electrode 500 is located is the first transparent conductive layer, and the layer where the pixel electrode 600 is located is the second transparent conductive layer. That is, the touch electrode 500 is closer to the base substrate 100 than the pixel electrode 600, i.e., the touch electrode 500, the insulation layer 700, the touch signal line 400 and the pixel electrode 600 are laminated one on another in a direction away from the base substrate 100.

Of course, it should be appreciated that, in actual use, the layer where the touch electrode 500 is located may also be the second transparent conductive layer, and the layer where the pixel electrode 600 is located may also be the first transparent conductive layer.

In addition, the distance between the touch signal line 400 and the touch electrode 500 in the direction perpendicular to the base substrate 100 depends on a film layer thickness of the insulation layer 700. It should be appreciated that, a thickness of each of the two insulation layers between the 1ITO layer and the 2ITO layer in the related art is about 4000 Å. In the embodiments of the present disclosure, the thickness of the insulation layer 700 may be greater than 5000 Å, such as 5500 Å, 6000 Å, 6500 Å and 7000 Å. Optionally, the thickness of the insulation layer 700 may be greater than or equal to 6000 Å. In this way, it is able to further reduce the capacitance between the touch signal line 400 and the touch electrode 500, thereby to reduce the touch loading.

Of course, it should be appreciated that, in actual use, the film layer thickness of the insulation layer 700 is not limited thereto, e.g., the film layer thickness of the insulation layer 700 may be reduced appropriately for some ultra-thin display products.

Figure 2:
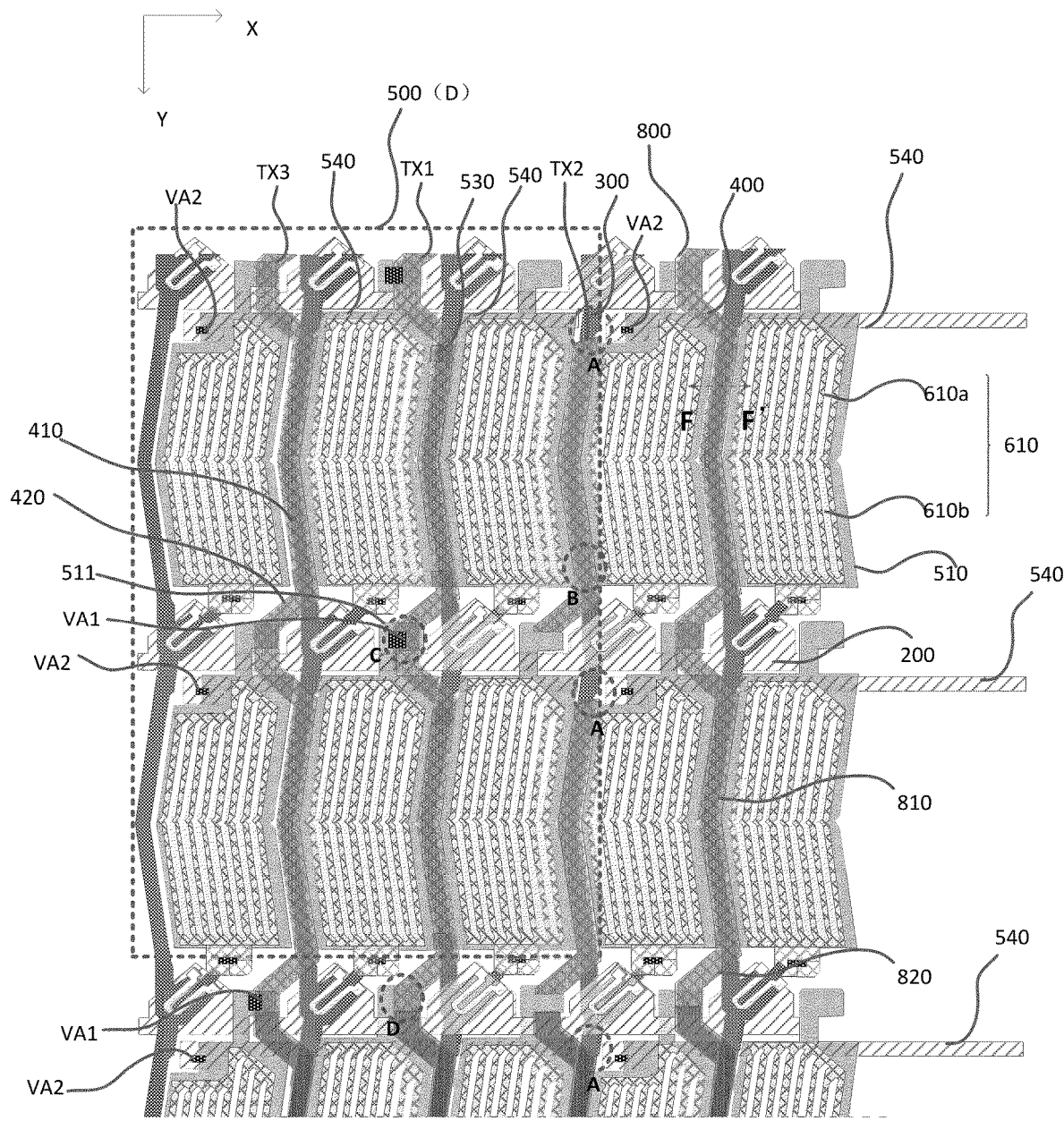
FIG. 2 is a schematic view showing the arrangement of sub-pixels in an array substrate according to one embodiment of the present disclosure.

As shown in FIG. 2 and FIG. 3, in a possible embodiment of the present disclosure, the touch signal line 400 includes a first portion 410 arranged at a side of the pixel electrode 600 in the first direction X and extending in the second direction Y, and an orthogonal projection of the first portion 410 onto the base substrate 100 does not coincide with an orthogonal projection of one touch sub-electrode 510 adjacent to the first portion 410 in the first direction X onto the base substrate 100 and an orthogonal projection of one pixel electrode 600 adjacent to the first portion 410 in the first direction X onto the base substrate 100.

Based on the above, each gate line 200 crosses the plurality of data lines 300 to define the plurality of sub-pixels, the light shielding region of each sub-pixel includes a first light shielding region extending in the second direction Y and a second light shielding region extending in the first direction X, the first portion 410 of the touch signal line 400 is arranged in the first light shielding region, and the first portion 410 does not overlap with the touch sub-electrode 510, so as to effectively reduce a capacitance between the touch signal line 400 and the touch sub-electrode 510, thereby to reduce the touch loading. The first portion 410 does not overlap with the pixel electrode 600, so as to prevent the occurrence of signal interference.

In addition, the touch electrode 500 is arranged in the touch region of the array substrate, and it includes a plurality of touch sub-electrodes 510 independent of each other. The plurality of touch electrodes 500 is arranged in an array form, i.e., the touch region is divided into a plurality of touch sub-regions, and each touch sub-electrode 510 is, but not limited to, arranged in a corresponding touch sub-region.

Each touch electrode 500 includes a plurality of touch sub-electrodes 510, and each touch sub-electrode 510 is arranged in a corresponding touch sub-region. The touch sub-electrodes 510 of a same touch electrode 500 are coupled to each other and coupled to a corresponding touch signal line 400, and different touch electrodes 500 are not coupled to each other.

The orthogonal projection of the gate line 200 onto the base substrate 100 and the orthogonal projection of the data line 300 onto the base substrate 100 do not overlap with the orthogonal projection of the touch sub-electrode 510 onto the base substrate 100, so it is able to prevent the interference between a signal on the touch electrode 500 and signals on the data line 300 and the gate line 200.

It should be appreciated that, a specific position of the touch region may be set according to the practical need. For example, the touch region coincides with an entire display region of the LCD panel, or the touch region is arranged in the display region and merely coincides with a designated region in the display region. In other words, for the plurality of sub-pixels on the array substrate, each sub-pixel is provided with a touch sub-electrode 510, or a part of the sub-pixels are provided with the touch sub-electrodes 510 and the other part of the sub-pixels are not provided with the touch sub-electrodes 510.

For example, the touch signal line 400 further includes a second portion 420 arranged at a side of the pixel electrode 600 in the second direction Y, an orthogonal projection of the second portion 420 onto the base substrate 100 does not coincide with an orthogonal projection of one pixel electrode 600 adjacent to the second portion 420 in the second direction Y onto the base substrate 100, and each second portion 420 is electrically coupled to a touch sub-electrode through a via hole in the insulation layer.

Based on the above, the second portion 420 of each touch signal line 400 is coupled to the touch sub-electrodes 510 in at least one column in the second direction Y through a via hole VA1. In this way, each touch signal line 400 is coupled to a corresponding touch sub-electrode 510.

It should be appreciated that, based on the above, the second portion of each touch signal line 400 is provided with a via overlapping region, and is merely coupled to a corresponding touch sub-electrode in the via overlapping region, so as to form the touch sub-electrodes on a regional basis in the second direction Y.

The above are for illustrative purposes only, and in some other embodiments of the present disclosure, the touch signal line 400 may be coupled to a corresponding touch sub-electrode 510 in other ways. For example, the touch signal line 400 merely overlaps with the corresponding touch sub-electrode 510 to form an overlapping region, and is coupled to the corresponding touch sub-electrode 510 through a via hole in the overlapping region. The touch signal line 400 does not overlap with the other touch sub-electrodes 510.

In a possible embodiment of the present disclosure, as shown in FIG. 2, the touch sub-electrodes 510 of a same touch electrode 500 in the first direction X are coupled to each other, and orthogonal projections of the touch sub-electrodes 510 of different touch electrodes 500 in the first direction X onto the base substrate 100 are separated from each other and decoupled from each other; and orthogonal projections of at least a part of adjacent touch sub-electrodes 510 in the same touch electrode 500 in the second direction Y onto the base substrate 100 are separated from each other and decoupled from each other, and are electrically coupled to at least one same touch signal line, so that at least a part of the touch sub-electrodes 510 in the same touch electrode 500 in the second direction Y are electrically coupled to each other; and orthogonal projections of the touch sub-electrodes 510 of different touch electrodes 500 in the second direction Y onto the base substrate 100 are separated from each other and decoupled from each other.

In another possible embodiment of the present disclosure, the touch sub-electrodes 510 of a same touch electrode 500 in the first direction X are coupled to each other, and orthogonal projections of the touch sub-electrodes 510 of different touch electrodes 500 in the first direction X onto the base substrate 100 are separated from each other and decoupled from each other; and adjacent touch sub-electrodes 510 in a same touch electrode 500 in the second direction Y are coupled to each other, and orthogonal projections of the touch sub-electrodes 510 of different touch electrodes 500 in the second direction Y onto the base substrate 100 are separated from each other and decoupled from each other.

Based on the above, as shown in FIG. 2, the touch sub-electrodes in the touch electrodes 500 on the array substrate in the first direction X are formed on a regional basis through controlling the touch sub-electrode 510 of a certain touch electrode 500 to be decoupled from the touch sub-electrode 510 of another touch electrode 500 at a junction in the first direction X. The touch electrodes 500 in the second direction Y are formed on a regional basis through controlling whether the touch sub-electrodes 510 are coupled to the touch signal line 400.

FIG. 2 shows the formation of the sub-pixels on a regional basis. The touch sub-electrodes 510 covered by a dotted box D are arranged in the same touch electrode 500. It should be appreciated that, merely a part of the touch sub-electrodes 510 in one touch electrode 500 and merely six sub-pixels for one touch electrode 500 are shown. In an actual product, the quantity of the touch sub-electrodes 510 in one touch electrode 500 is not limited thereto.

In a possible embodiment of the present disclosure, the touch electrodes 500 in the first direction X are formed on a regional basis as follows. The touch sub-electrodes 510 in the same touch electrode 500 are coupled to each other in the first direction X through a connection bridge 530, the connection bridge 530 and the touch sub-electrodes 510 are arranged at a same layer and formed through a single patterning process, and the connection bridge 530 is not arranged between the touch sub-electrodes 510 in different touch electrodes 500 (no connection bridge 530 is arranged between two adjacent touch sub-electrodes 510 at a dotted circle B in FIG. 2). In this way, the touch sub-electrodes 510 in the same touch electrode 500 are coupled to each other in the first direction X, and the touch sub-electrodes 510 in different touch electrodes 500 are decoupled from each other.

In another possible embodiment of the present disclosure, the touch electrodes 500 in the first direction X are formed on a regional basis as follows. The touch sub-electrodes 510 in a same touch electrode 500 are coupled through a connection bridge 530 to or decoupled from each other in the first direction X. The array substrate is also provided with a connection wire 540 arranged at a different layer from the touch electrode, the connection wire 540 is coupled to the touch sub-electrode 500 through a half via hole VA2 in FIG. 2, and the connection wire 540 is not arranged between the touch sub-electrodes 510 in different touch electrodes 500 (the connection wire 540 is interrupted at a dotted circle A in FIG. 2). In this way, the touch sub-electrodes 510 in the same touch electrode 500 are coupled to each other in the first direction X through the connection wire 540, and the touch sub-electrodes 510 in different touch electrodes 500 are decoupled from each other. For example, the connection wire 540 is arranged at a same layer and made of a same material as the gate line, i.e., the connection wire 540 is formed through a single patterning process when a gate layer is patterned to form the gate electrode and gate line patterns.

It should be appreciated that, the touch sub-electrodes 510 in the same touch electrode 500 are coupled to each other in the first direction X only through the connection bridge 530, or coupled to each other in the first direction X only through the connection wire 540. In addition, the touch sub-electrodes 510 in the same touch electrode 500 are coupled to each other in the first direction X through the connection bridge 530 and the connection wire 540 at the same time (as shown in FIG. 2). In this way, it is able to not only reduce a resistance of the touch electrode, but also ensure the validity and reliability of the connection when any one of the above two connection modes is damaged.

In a possible embodiment of the present disclosure, the touch electrodes 500 in the second direction Y are formed on a regional basis as follows. A pattern of each touch sub-electrode 510 includes an extension portion 511 at least partially extending to the light shielding region of the sub-pixel, and an orthogonal projection of the extension portion 511 onto the base substrate at least partially overlaps with an orthogonal projection of the touch signal line onto the base substrate. An overlapping region (as indicated by a dotted circle B in FIG. 2) is provided with the via hole VA1 through which the touch sub-electrode is electrically coupled to the touch signal line 400. Considering a parasitic capacitance, an area of the overlapping region should be as small as possible. Each touch sub-electrode 510 in a same touch electrode 500 is coupled to the corresponding touch signal line 400 through the via hole VA1 in the overlapping region, and the touch sub-electrodes 510 in different touch electrodes 500 are decoupled from each other (no via hole VA1 being provided at the dotted circle D in FIG. 2).

To be specific, there is a plurality of touch signal lines 400 extending in the second direction Y and passing through the same pixel electrode 500, i.e., a touch signal line TX1, a touch signal line TX2 and a touch signal line TX3. Taking the touch electrode 500 in the dotted box D in FIG. 2 as an example, the touch signal line TX1 is coupled to the touch sub-electrode 510 in the pixel electrode 500 through the via hole VA1; the touch signal line TX2 is a dummy TX which is discontinuous, and all parts of TX2 are coupled in parallel to the touch electrode 500; the touch signal line TX3 passes through the touch electrode 500, is decoupled from the touch electrode 500, extends and is coupled to another touch electrode 500. At this time, the touch signal line TX3 serves as a touch signal line TX1 of the other touch electrode 500.

In addition, in another possible embodiment of the present disclosure, the touch electrodes 500 in the second direction Y are formed on a regional basis as follows. As shown in FIG. 3, in the touch sub-electrodes 510 arranged in two adjacent rows in the same touch electrode 500 in the second direction Y, each touch sub-electrode 510 in a previous row is provided with an extension portion 511 extending in a direction toward a current row, each touch sub-electrode 510 in the current row is provided with an extension portion 511 extending in a direction toward the previous row and coupled to the extension portion 511 of the touch sub-electrode 510 in the previous row, as indicated by a dotted circle E in FIG. 3, so that the touch sub-electrodes in the same touch electrode are coupled to each other in the second direction Y. In the touch sub-electrodes 510 in two adjacent rows in different touch electrodes 500 in the second direction Y, the touch sub-electrode 510 in at least one row are not provided with the extension portion 511, so as to be decoupled from the adjacent touch sub-electrode 510 in the other row.

It should be appreciated that, for example, the extension portions 511 of the touch sub-electrodes 510 in two adjacent rows extend in opposite directions to meet in a same overlapping region, and the touch sub-electrodes 510 in a same touch electrode 500 are coupled to each other through the via hole VA1 between the overlapping region C and the touch signal line 400.

Figure 4:
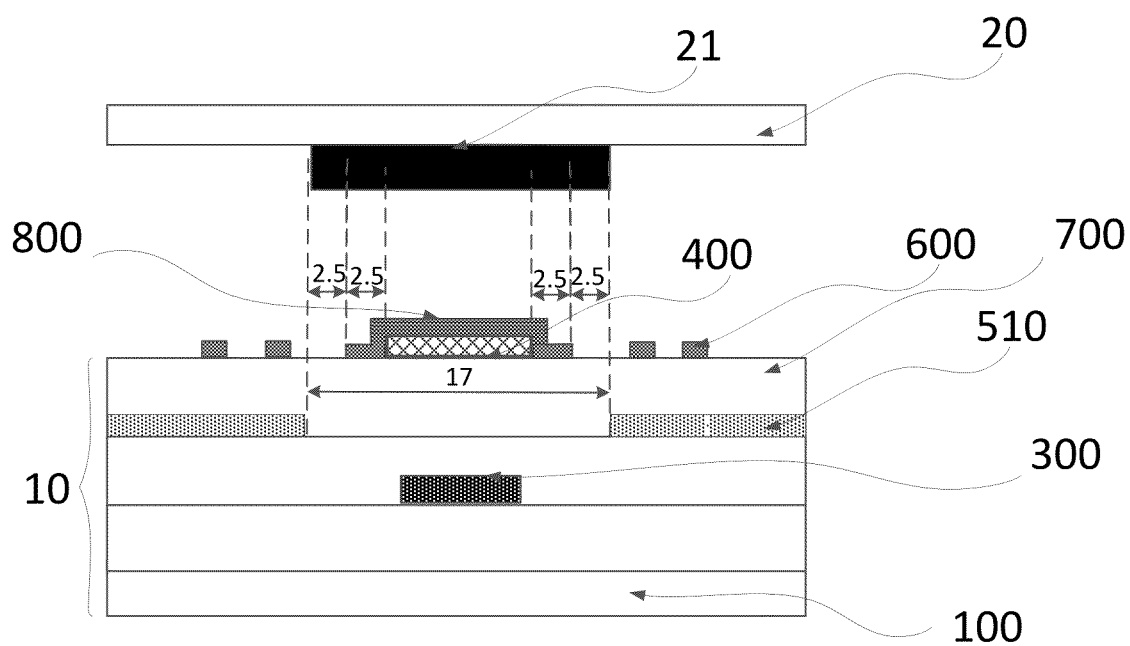
FIG. 4 is a schematic view showing a position relationship among a black matrix, a touch signal line and a data line along line F-F' in FIG. 1.

In addition, for example, as shown in FIG. 4, in a direction parallel to the base substrate 100 and perpendicular to the second direction Y, a minimum distance between a boundary of the first portion 410 and a boundary of the touch electrode 500 adjacent to the first portion 410 in the first direction X is greater than or equal to 2.5 µm and less than or equal to 10 µm.

Based on above, considering a tolerance in the patterning process of the touch signal lines 400 and the touch electrodes 500, in order to further ensure that the first portion 410 of the touch signal line 400 does not overlap with the touch electrode 500, the minimum distance between the boundary of the first portion 410 and the touch electrode 500 adjacent to the first portion 410 is greater than or equal to 5 µm and less than or equal to 10 µm. In this way, it is able to meet the requirement on accuracy, and prevent the touch signal lines 400 from overlapping with the touch electrodes 500 due to a position error in the patterning process of the touch signal lines 400 or the touch electrodes 500.

In addition, in a possible embodiment of the present disclosure, as shown in FIG. 2, the data line 300 includes a third portion 310 arranged at a side of the pixel electrode 600 in the first direction X and extending in the second direction Y, and the orthogonal projection of the first portion 410 onto the base substrate 100 at least partially overlaps with an orthogonal projection of the third portion 310 onto the base substrate 100.

It should be appreciated that, a ratio of an area of an overlapping region between the orthogonal projection of the first portion 410 onto the base substrate 100 and the orthogonal projection of the third portion 310 onto the base substrate 100 to an area of the third portion 310 is greater than 70%, such as 80%, 90% or 100%. The larger the ratio, the larger the aperture ratio.

Based on above, an orthogonal projection of the data line 300 arranged at a side of the pixel electrode 600 in the first direction X onto the base substrate partially or completely overlaps with the orthogonal projection of the touch signal line 400 onto the base substrate 100, as shown in FIG. 3, so that the black matrix 21 on the counter substrate 20 opposite to the array substrate 10 is arranged directly opposite to the touch signal line 400 and the data line 300.

In addition, in a possible embodiment of the present disclosure, the touch signal line 400 is provided with a center line extending in an extension direction of the touch signal line. In the direction parallel to the base substrate 100 and perpendicular to the second direction Y, distances between a center line of the first portion 410 and boundaries of two touch sub-electrodes 510 arranged on two opposite sides of first portion 410 in the first direction X are the same. In this way, the 1ITO layer and the 2ITO layer are symmetrical with respect to the touch signal line 400, i.e., a distance between the touch signal line 400 and an electrode on the left is the same as a distance between the touch signal line 400 and an electrode on the right. In this way, it is able to prevent the occurrence of any defect caused by different parasitic capacitances between the touch signal line 400 and each of the electrode on the left and the electrode on the right.

In addition, for example, the array substrate further includes a plurality of protection patterns 800 extending in the second direction Y, the plurality of protection patterns 800 is arranged in the light shielding regions of the sub-pixels and covers at least a side surface of the touch signal line 400 away from the insulation layer 700, and an orthogonal projection of the protection pattern 800 onto the base substrate 100 at least partially overlaps with an orthogonal projection of the touch signal line 400 onto the base substrate 100.

Based on above, in order to reduce a resistance of the touch signal line 400, the touch signal line 400 is usually made of a conductive material, such as aluminum. However, aluminum is easily oxidized when it is exposed to the air. In order to prevent the touch signal line 400 from being oxidized, the protection pattern 800 covers at least one side surface of the touch signal line 400 away from the insulation layer 700.

In a possible embodiment of the present disclosure, as shown in FIG. 4, the protection pattern 800 is made of a same material as the pixel electrode 600, and is arranged on the first transparent conductive layer or the second transparent conductive layer where the pixel electrode is located 600, i.e., the protection pattern 800 may be formed by patterning the first transparent conductive layer or the second transparent conductive layer where the pixel electrode is located. Based on above, during the manufacture of the array substrate, as shown in FIG. 3, the touch signal line 400 is formed on the insulation layer 700, and then the second transparent conductive layer covers the entire surface of the insulation layer 700 and is patterned to form the pixel electrode 600 and the protection pattern 800. In this way, it is unnecessary to add any process for forming the protection pattern 800. Of course, it should be appreciated that, the protection pattern 800 may be made of a material different from the pixel electrode 600, i.e., the protection pattern 800 may cover the touch signal line 400 and be arranged at a layer and made of a material different from the pixel electrode 600.

In a possible embodiment of the present disclosure, as shown in FIG. 4, in the direction parallel to the base substrate 100 and perpendicular to the second direction Y, a size of the touch signal line 400 is less than or equal to a size of the protection pattern 800.

As shown in FIG. 4, in the embodiments of the present disclosure, the protection pattern 800 is arranged at a side of the touch signal line 400 away from the base substrate 100, i.e., after the array substrate is arranged opposite to the counter substrate to form a cell, the protection pattern 800 is arranged at a side of the touch signal line 400 close to the counter substrate. When a width of the protection pattern 800 is greater than a width of the touch signal line 400, the touch signal line 400 is completely covered by the protection pattern 800.

In a possible embodiment of the present disclosure, as shown in FIG. 4, the touch signal line 400 is provided with a center line extending in an extension direction of the touch signal line. The protection pattern 800 is provided with a center line extending in an extension direction of the protection pattern. An orthogonal projection of the center line of the touch signal line 400 onto the base substrate 100 coincides with an orthogonal projection of the center line of the protection pattern onto the base substrate. As shown in FIG. 4, in the embodiments of the present disclosure, a center of the touch signal line 400 coincides with a center of the protection pattern 800. At this time, the touch signal line 400 is completely covered by the protection pattern 800 at a same level in the first direction X.

For example, in the first direction X, a boundary of an orthogonal projection of the protection pattern 800 onto the base substrate 100 exceeds a boundary of an orthogonal projection of the touch signal line 400 onto the base substrate 100 by 0 to 5 μm. As shown in FIG. 5, the protection pattern 800 needs to completely cover the touch signal line 400 in the first direction X, so the width of the protection pattern 800 in the first direction X should be greater than or equal to the width of the touch signal line 400. Considering a tolerance of the process, in order to ensure that the protection pattern 800 completely covers the touch signal line 400, the width of the protection pattern 800 in the first direction X should be greater than the width of the touch signal line by 0 to 5 μm. As shown in the FIG. 5, in the first direction X, the boundary of the orthogonal projection of the protection pattern 800 onto the base substrate 100 exceeds the boundary of the orthogonal projection of the touch signal line 400 onto the base substrate 100 by 2.5 μm.

In addition, for example, the protection pattern 800 includes a fifth portion 810 arranged at a side of the pixel electrode 600 in the first direction X and extending in the second direction Y, and an orthogonal projection of the fifth portion 810 onto the base substrate 100 does not coincide with an orthogonal projection of one touch electrode 500 adjacent to the fifth portion 810 in the first direction X onto the base substrate 100 and an orthogonal projection of one pixel electrode 600 adjacent to the fifth portion 810 in the first direction X onto the base substrate 100.

In a possible embodiment of the present disclosure, as shown in FIG. 4, a minimum distance between a boundary of the fifth portion 810 and a boundary of the touch electrode

500 adjacent to the fifth portion 810 in the first direction X is greater than or equal to 2.5 μm, so as to prevent the protection pattern 800 from overlapping with the touch electrode 500 in the first direction X when the tolerance of the process is taken into consideration.

In a possible embodiment of the present disclosure, as shown in FIG. 4, the protection pattern 800 further includes a sixth portion 820 arranged at a side of the pixel electrode 600 in the second direction Y, an orthogonal projection of the sixth portion 820 onto the base substrate 100 does not coincide with an orthogonal projection of one pixel electrode 600 adjacent to the sixth portion 820 in the second direction Y onto the base substrate 100, the sixth portion 820 at least partially exceeds the second portion 420 in a width direction of the second portion 420, the width direction of the second portion 420 is perpendicular to a wiring direction of the second portion 420, and the sixth portion 820 covers the entire via hole VA1, so as to achieve half-via connection.

In addition, in the related art, in order to reduce a resistance of the pixel electrode, the pixel electrode is provided with a plurality of slits, and an extension direction of the slits is substantially the same as an extension direction of the gate line, i.e., the array substrate is provided with a transverse Advanced Super Dimension Switch (ADS) design. In order to achieve a normal display function of the LCD panel, an extension direction of grooves in an alignment layer needs to be the same as the extension direction of the slits, i.e., during the alignment, alignment cloth needs to rub an alignment film in a direction perpendicular to an extension direction of the data line. When a rubbing operation is made near the data line, the alignment cloth needs to climb at the data line. At this time, a large rubbing shadow region will occur near the data line, and a light leakage easily occurs at the rubbing shadow region. Hence, the rubbing shadow region needs to be shielded by the black matrix pattern on the counter substrate after the array substrate is arranged opposite to the counter substrate to form a cell. At this time, a width of the black matrix pattern in the direction perpendicular to the extension direction of the data line increases and thereby an aperture ratio of the LCD panel is reduced.

Based on the above problems, it is found through researches that, through changing the extension direction of the slits to be the same as the extension direction of the data line 300 and enabling the alignment direction to be the same as the extension direction of the data line 300, it is able to prevent the formation of the rubbing shadow region near the data line 300, thereby to reduce the width of the black matrix pattern for shielding the data line 300 in the direction perpendicular to the extension direction of the data line 300, and effectively increase the aperture ratio of the LCD panel. As compared with the transverse ADS design, in the vertical ADS design, through the vertical design of the slits (i.e., the slits extend in the second direction Y), it is able to reduce an area of the black matrix, thereby to increase the aperture ratio, and improve the light transmittance. In some embodiments of the present disclosure, each pixel electrode 600 includes a plurality of slits 610 extending in the second direction Y, i.e., the array substrate is provided with a vertical ADS design.

Here, when the slit 610 extends in the second direction Y, it means that the slit 610 extends in the second direction Y as a whole. In a possible embodiment of the present disclosure, the pixel electrode 600 includes a domain, and the slit is of a linear shape. In another possible embodiment of the present disclosure, the pixel electrode 600 includes two domains, and as shown in FIG. 1, each slit includes a first sub-slit 610a and a second sub-slit 610b angled relative to the first sub-slit 610a by an obtuse angle θ.

The alignment layer is formed on the array substrate as follows. An alignment material film is formed on a side of the array substrate with the pixel electrode 600, and then rubbed with the alignment cloth in the extension direction of the slit of the pixel electrode 600 (i.e., the extension direction of the data line 300) to form the alignment layer with grooves. An extension direction of the groove is the same as the extension direction of the slit.

The slit extends in the second direction Y, and when the alignment film is aligned through the alignment cloth, the alignment cloth moves along the second direction Y, so as to prevent the formation of a large rubbing shadow region near the data line 300 during the alignment. At this time, there is no light leakage caused by the rubbing shadow region, so it is able to provide a light shielding strip in the black matrix with a small width in the first direction X, thereby to effectively increase the aperture ratio. The quantity and length of the slits will not be particularly defined herein.

It should be appreciated that, FIG. 2 shows the arrangement of the sub-pixels in the array substrate. In FIG. 2, a line includes a curved portion with a sharp angle. In an actual product, due to the manufacture process, the curved portion should be rounded, which is not shown in FIG. 2 for ease of drawing.

The present disclosure further provides in some embodiments a display device, which includes an array substrate 10, a counter substrate 20 arranged opposite to the array substrate 10, and a liquid crystal layer 30 arranged between the array substrate 10 and the counter substrate 20. The array substrate 10 is the above-mentioned array substrate.

For example, a black matrix 21 is arranged on the counter substrate 20, and an orthogonal projection of the black matrix 21 onto the array substrate is located within a light shielding region of a sub-pixel. In a direction parallel to the base substrate 100 and perpendicular to a second direction Y, a distance between a boundary of an orthogonal projection of the black matrix 21 onto the base substrate 100 and a boundary of an orthogonal projection of the pixel electrode 600 in one sub-pixel adjacent to the black matrix 21 onto the base substrate 100 is the same as a distance between the boundary of the orthogonal projection of the black matrix 21 onto the base substrate 100 and a boundary of an orthogonal projection of the pixel electrode 600 in the other sub-pixel adjacent to the black matrix 21 onto the base substrate 100, and a distance between the boundary of the orthogonal projection of the black matrix 21 onto the base substrate 100 and a boundary of an orthogonal projection of a common electrode in one sub-pixel adjacent to the data line onto the base substrate 100 is the same as a distance between the boundary of the orthogonal projection of the black matrix 21 onto the base substrate 100 and a boundary of an orthogonal projection of a common electrode in the other sub-pixel adjacent to the black matrix 21 onto the base substrate 100.

Based on the above, the 1ITO layer and the 2ITO layer are symmetrical with respect to the black matrix 21, i.e., a distance between the black matrix 21 and an electrode on the left is the same as a distance between the black matrix 21 and an electrode on the right, so as to improve a shielding effect of the black matrix, thereby to improve the light transmittance of the sub-pixel, i.e., the symmetry of the pixel.

It should be appreciated that, the display device may be any product or member having a display function, such as a liquid crystal display panel, a television, a monitor, a digital photo frame, a mobile phone, an electronic paper, a tablet computer, a laptop computer, or a navigator.

The display device includes the above-mentioned array substrate, so it has the same beneficial effects, which will thus not be particularly defined herein.

In addition, the present disclosure further provides in some embodiments a method for manufacturing the above-mentioned array substrate, which includes the following steps.

Step S01: providing the base substrate 100.

Step S02: forming the plurality of gate lines 200, the plurality of data lines 300, the plurality of touch signal lines 400, the plurality of touch electrodes 500, the plurality of pixel electrodes 600 and the insulation layer 700 on the base substrate 100. Each gate line 200 extending in the first direction X crosses the plurality of data lines 300 extending in the second direction Y to define the plurality of sub-pixels, and the plurality of touch signal lines 400 extends in the second direction Y and is arranged in the light shielding regions of the sub-pixels; each touch electrode 500 includes the plurality of touch sub-electrodes 510, and each touch sub-electrode 510 is arranged in at least one of the sub-pixels; a layer where one of the pixel electrode 600 and the touch electrode 500 closer to the base substrate 100 is located is the first transparent conductive layer, and a layer where the other is located is the second transparent conductive layer; and the insulation layer 700 is arranged between the first transparent conductive layer and the second transparent conductive layer, the touch signal line 400 and the transparent conductive layer where the pixel electrode 500 is located are arranged at the side of the insulation layer 700 away from the transparent conductive layer where the touch electrode 500 is located, the touch signal line 400 is in direct contact with the transparent conductive layer where the pixel electrode 500 is located, the orthogonal projection of the pixel electrode 500 onto the base substrate 100 is separated from the orthogonal projection of the touch signal line 400 onto the base substrate 100 to be insulated from each other, and each touch electrode 500 is coupled to at least one touch signal line 400 through the via hole in the insulation layer 700.

Based on the above array substrate, the first transparent conductive layer is a first indium tin oxide (ITO) (1ITO) layer, the second transparent conductive layer is a second ITO (2ITO) layer, the 1ITO layer is arranged between the base substrate 100 and the 2ITO layer, e.g., the 1ITO layer includes a common electrode (Vcom), the 2ITO layer includes the pixel electrode 600, the insulation layer 700 is arranged between the 1ITO layer and the 2ITO layer, the touch signal line 400 and at least a part of a pattern of the 2ITO layer (e.g., a pattern of the pixel electrode) are directly formed on a surface of the insulation layer 700 away from the 1ITO layer. In the related art, two insulation layers are arranged between the 1ITO layer and the 2ITO layer, and the touch signal line is arranged between the two insulation layers. According to the embodiments of the present disclosure, merely one insulation layer is arranged between the 1ITO layer and the 2ITO layer, and the touch signal line is arranged at a same layer as a part of a pattern of the transparent conductive layer where the pixel electrode is located. A thickness of any insulation layer in the related art is less than a thickness of the insulation layer in the present disclosure. For example, a thickness of one PVX layer in the related art is 4000 Å, i.e., a distance between the touch signal line and the 1ITO is about 4000 Å; and in the embodiments of the present disclosure, a thickness of the insulation layer is greater than or equal to 5000 Å and less than or equal to 20000 Å, such as 5500 Å, 6000 Å, 6500 Å and 7000 Å. In this way, as compared with the array substrate in the related art, it is equivalent to shifting the touch signal line 400 to a side away from the 1ITO layer, i.e., a distance between the touch signal line 400 and the touch electrode 500 in a direction perpendicular to the base substrate 100 increases, so it is able to reduce a capacitance between the touch signal line 400 and the touch electrode 500, thereby to reduce the touch loading and improve the touch performance. In addition, merely one insulation layer 700 is arranged between the 1ITO layer and the 2ITO layer, so it is able to reduce one process for forming the insulation layer, thereby to reduce the tact time.

In the embodiments of the present disclosure, Step S02 specifically includes the following steps.

Step S021: forming the gate line 200 and a gate electrode of a driving transistor on the base substrate 100.

To be specific, a first gate metal layer (Gate layer) is formed on the base substrate 100, and it includes a first molybdenum layer, a first aluminum layer and a second molybdenum layer laminated one on another in a direction away from the base substrate 100. The first gate metal layer is subjected to a patterning process to form the gate line 200 and a pattern of the gate electrode. The patterning process includes coating, exposing, developing, and wet etching.

Step S022: forming a driving circuitry and the data line 300 on the base substrate 100 on which the gate line 200 and the gate electrode are formed.

To be specific, in Step S022, an entire gate insulation layer 700 is deposited to cover the gate line 200 and the pattern of the gate electrode, and a material of the gate insulation layer 700 includes silicon nitride.

Next, an active layer of the TFT is formed.

Then, a source/drain metal layer of the TFT is formed. The source/drain metal layer includes a third molybdenum layer, a second aluminum layer and a fourth molybdenum layer laminated one on another in a direction away from the base substrate 100. The source/drain metal layer is subjected to a patterning process to form an input electrode and an output electrode of the driving circuitry, and the data line 300. The patterning process includes coating, exposing, developing, and wet etching.

Step S023: forming an organic insulation layer 700 on the base substrate 100 on which the driving circuitry is formed. The organic insulation layer 700 covers the output electrode of the driving circuitry and the data line 300.

To be specific, in the embodiments of the present disclosure, a silicon nitride material is deposited to form a buffer layer, and then an organic resin is deposited at a side of the buffer layer away from the base substrate 100 to form the entire organic insulation layer 700.

Step S024: forming the first transparent conductive layer on the base substrate 100 and patterning the first transparent conductive layer to form a pattern including the touch electrode 500.

To be specific, in Step S024, the 1ITO layer is made of indium tin oxide. The 1ITO layer is subjected to a patterning process to form the common electrode (i.e., the touch electrode 500), and the patterning process includes coating, exposing, developing, and wet etching.

Step S025: forming the insulation layer 700 covering the common electrode.

To be specific, in Step S025, a silicon nitride material is deposited to from the entire insulation layer 700.

Step S026: forming the insulation layer 700 on the first transparent conductive layer.

Step S027: forming the first metal layer on the insulation layer 700 and patterning the first metal layer to form a pattern including the touch signal line 400.

Step S028: forming the second transparent conductive layer on the first metal layer and patterning the second transparent conductive layer to form a pattern including the pixel electrode 600.

To be specific, in Step S028, the 2ITO layer is made of indium tin oxide. The 2ITO layer is subjected to a patterning process to form the pattern including the pixel electrode 600, and the patterning process includes coating, exposing, developing, and wet etching.

In addition, the method further Step S029 of forming the protection pattern 800 covering the touch signal lines 400.

To be specific, in Step S029, the protection pattern 800 and the pattern including the pixel electrode 600 are formed by patterning the second transparent conductive layer through a single patterning process, i.e., Step S028 and Step S029 are achieved in a same process.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising:
    a base substrate;
    a plurality of gate lines extending in a first direction and a plurality of data lines extending in a second direction on the base substrate, each gate line crossing the plurality of data lines to define a plurality of sub-pixels;
    a plurality of touch signal lines extending in the second direction and arranged in light shielding regions of the sub-pixels;
    a plurality of touch electrodes, each touch electrode comprising a plurality of touch sub-electrodes, each touch sub-electrode being arranged in at least one of the sub-pixels;
    a plurality of pixel electrodes, each pixel electrode being arranged in at least one of the sub-pixels, one of a layer where one of the pixel electrode and the touch electrode closer to the base substrate is located being a first transparent conductive layer, and a layer where the other is located being a second transparent conductive layer; and
    an insulation layer arranged between the first transparent conductive layer and the second transparent conductive layer,
    wherein the touch signal line and a transparent conductive layer where the pixel electrode is located are arranged at a side of the insulation layer away from a transparent conductive layer where the touch electrode is located, the touch signal line is in direct contact with the transparent conductive layer where the pixel electrode is located, an orthogonal projection of the pixel electrode onto the base substrate is separated from an orthogonal projection of the touch signal line onto the base substrate to be insulated from each other, and each touch electrode is coupled to at least one touch signal line through a via hole in the insulation layer.

2. The array substrate according to claim 1, wherein the layer where the touch electrode is located is the first transparent conductive layer, and the layer where the pixel electrode is located is the second transparent conductive layer.

3. The array substrate according to claim 1, wherein a film layer thickness of the insulation layer is greater than or equal to 5000 Å and less than or equal to 20000 Å.

4. The array substrate according to claim 1, wherein the touch signal line comprises a first portion arranged at a side of the pixel electrode in the first direction and extending in the second direction, and an orthogonal projection of the first portion onto the base substrate does not coincide with an orthogonal projection of a touch sub-electrode adjacent to the first portion in the first direction onto the base substrate and an orthogonal projection of a pixel electrode adjacent to the first portion in the first direction onto the base substrate.

5. The array substrate according to claim 4, wherein the touch signal line further comprises a second portion arranged at a side of the pixel electrode in the second direction, an orthogonal projection of the second portion onto the base substrate does not coincide with an orthogonal projection of a pixel electrode adjacent to the second portion in the second direction onto the base substrate, and each second portion is electrically coupled to a touch sub-electrode through a via hole in the insulation layer.

6. The array substrate according to claim 5, wherein the touch sub-electrodes of a same touch electrode in the first direction are coupled to each other, orthogonal projections of the touch sub-electrodes of different touch electrodes in the first direction onto the base substrate are separated from each other and decoupled from each other, orthogonal projections of at least a part of adjacent touch sub-electrodes of the same touch electrode in the second direction onto the base substrate are separated from each other and decoupled from each other, and are electrically coupled to at least one touch signal line so that at least a part of the touch sub-electrodes of the same touch electrode in the second direction are electrically coupled to each other, and orthogonal projections of the touch sub-electrodes of different touch electrodes in the second direction onto the base substrate are separated from each other and decoupled from each other.

7. The array substrate according to claim 5, wherein the touch sub-electrodes of a same touch electrode in the first direction are coupled to each other, orthogonal projections of the touch sub-electrodes of different touch electrodes in the first direction onto the base substrate are separated from each other and decoupled from each other, adjacent touch sub-electrodes of a same touch electrode in the second direction are coupled to each other, and orthogonal projections of the touch sub-electrodes of different touch electrodes in the second direction onto the base substrate are separated from each other and decoupled from each other.

8. The array substrate according to claim 4, wherein in a direction parallel to the base substrate and perpendicular to the second direction, a minimum distance between a boundary of the first portion and a boundary of the touch electrode adjacent to the first portion in the first direction is greater than or equal to 2.5 μm and less than or equal to 10 μm.

9. The array substrate according to claim 4, wherein the data line comprises a third portion arranged at a side of the pixel electrode in the first direction and extending in the second direction, and the orthogonal projection of the first portion onto the base substrate at least partially overlaps with an orthogonal projection of the third portion onto the base substrate.

10. The array substrate according to claim 4, wherein the touch signal line is provided with a center line extending in an extension direction of the touch signal line, and in the direction parallel to the base substrate and perpendicular to the second direction, distances between a center line of the first portion and boundaries of two touch sub-electrodes arranged on two opposite sides of first portion in the first direction are the same.

11. The array substrate according to claim 5, further comprising a plurality of protection patterns extending in the second direction, wherein the plurality of protection patterns is arranged in the light shielding regions of the sub-pixels and covers at least a side surface of the touch signal line away from the insulation layer, and an orthogonal projection of the protection pattern onto the base substrate at least partially overlaps with an orthogonal projection of the touch signal line onto the base substrate;
wherein the protection pattern is made of a same material as the pixel electrode, and is arranged on the first transparent conductive layer or the second transparent conductive layer where the pixel electrode is located.

12. The array substrate according to claim 11, wherein in the direction parallel to the base substrate and perpendicular to the second direction, a size of the touch signal line is less than or equal to a size of the protection pattern.

13. The array substrate according to claim 12, wherein the touch signal line is provided with a center line extending in an extension direction of the touch signal line, the protection pattern is provided with a center line extending in an extension direction of the protection pattern, and an orthogonal projection of the center line of the touch signal line onto the base substrate coincides with an orthogonal projection of the center line of the protection pattern onto the base substrate;
wherein in the first direction, a boundary of an orthogonal projection of the protection pattern onto the base substrate exceeds a boundary of an orthogonal projection of the touch signal line onto the base substrate by 0 to 5 μm.

14. The array substrate according to claim 12, wherein the protection pattern comprises a fifth portion arranged at a side of the pixel electrode in the first direction and extending in the second direction, and an orthogonal projection of the fifth portion onto the base substrate does not coincide with an orthogonal projection of one touch electrode adjacent to the fifth portion in the first direction onto the base substrate and an orthogonal projection of one pixel electrode adjacent to the fifth portion in the first direction onto the base substrate.

15. The array substrate according to claim 12, wherein the protection pattern further comprises a sixth portion arranged at a side of the pixel electrode in the second direction, an orthogonal projection of the sixth portion onto the base substrate does not coincide with an orthogonal projection of one pixel electrode adjacent to the sixth portion in the second direction onto the base substrate, the sixth portion at least partially exceeds the second portion in a width direction of the second portion, the width direction of the second portion is perpendicular to a wiring direction of the second portion, and the sixth portion covers the via hole.

16. The array substrate according to claim 14, wherein in the first direction, a minimum distance between a boundary of the fifth portion and a boundary of the touch electrode adjacent to the fifth portion is greater than or equal to 2.5 μm.

17. The array substrate according to claim 1, wherein each pixel electrode comprises a plurality of slits extending in the second direction.

18. A display device, comprising the array substrate according to claim 1, a counter substrate arranged opposite to the array substrate, and a liquid crystal layer arranged between the array substrate and the counter substrate;
wherein a black matrix is arranged on the counter substrate, an orthogonal projection of the black matrix onto the array substrate is located within the light shielding region of the sub-pixel, in the direction parallel to the base substrate and perpendicular to the second direction, a distance between a boundary of an orthogonal projection of the black matrix onto the base substrate and the boundary of the orthogonal projection of the pixel electrode in one sub-pixel adjacent to the black matrix onto the base substrate is the same as a distance between the boundary of the orthogonal projection of the black matrix onto the base substrate and a boundary of the orthogonal projection the pixel electrode in the other sub-pixel adjacent to the black matrix onto the base substrate, and a distance between the boundary of the orthogonal projection of the black matrix onto the base substrate and the boundary of the orthogonal projection of a touch sub-electrode in one sub-pixel adjacent to the data line onto the base substrate is the same as a distance between the boundary of the orthogonal projection of the black matrix onto the base substrate and a boundary of an orthogonal projection a touch sub-electrode in the other sub-pixel adjacent to the black matrix onto the base substrate.

19. A method for manufacturing the array substrate according to claim 1, comprising:
providing a base substrate; and
forming a plurality of gate lines, a plurality of data lines, a plurality of touch signal lines, a plurality of touch electrodes, a plurality of pixel electrodes and an insulation layer on the base substrate,
wherein each gate line extending in the first direction crosses the plurality of data lines extending in the second direction to define a plurality of sub-pixels, and the plurality of touch signal lines extends in the second direction and is arranged in light shielding regions of the sub-pixels;
each touch electrode comprises a plurality of touch sub-electrodes, and each touch sub-electrode is arranged in at least one of the sub-pixels;
a layer where one of the pixel electrode and the touch electrode closer to the base substrate is located is a first transparent conductive layer, and a layer where the other is located is a second transparent conductive layer; and
the insulation layer is arranged between the first transparent conductive layer and the second transparent conductive layer, the touch signal line and the transparent conductive layer where the pixel electrode is located are arranged at the side of the insulation layer away from a transparent conductive layer where the touch electrode is located, the touch signal line is in direct contact with a transparent conductive layer where the pixel electrode is located, an orthogonal projection of the pixel electrode onto the base substrate is separated from an orthogonal projection of the touch signal line onto the base substrate to be insulated from each other, and each touch electrode is coupled to at least one touch signal line through a via hole in the insulation layer.

20. The method according to claim 19, wherein the forming the plurality of gate lines, the plurality of data lines, the plurality of touch signal lines, the plurality of touch electrodes, the plurality of pixel electrodes and the insulation layer on the base substrate comprises:

forming the first transparent conductive layer on the base substrate and patterning the first transparent conductive layer to form a pattern comprising the touch electrode;

forming the insulation layer on the first transparent conductive layer;

forming a first metal layer on the insulation layer and patterning the first metal layer to form a pattern comprising the touch signal line; and forming the second transparent conductive layer on the first metal layer and patterning the second transparent conductive layer to form a pattern comprising the pixel electrode;

wherein the forming the plurality of gate lines, the plurality of data lines, the plurality of touch signal lines, the plurality of touch electrodes, the plurality of pixel electrodes and the insulation layer on the base substrate further comprises forming a protection pattern covering the touch signal lines, and the protection pattern and the pattern comprising the pixel electrode are formed by patterning the second transparent conductive layer through a single patterning process.

* * * * *